United States Patent
Wang et al.

(10) Patent No.: US 10,700,305 B2
(45) Date of Patent: Jun. 30, 2020

(54) SUBSTRATE, DISPLAY PANEL AND DISPLAY DEVICE

(71) Applicant: BOE TECHNOLOGY GROUP CO., LTD., Beijing (CN)

(72) Inventors: Tao Wang, Beijing (CN); Ziyu Zhang, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/414,224

(22) Filed: May 16, 2019

(65) Prior Publication Data

US 2020/0035944 A1 Jan. 30, 2020

(30) Foreign Application Priority Data

Jul. 25, 2018 (CN) .......................... 2018 1 0826927

(51) Int. Cl.
*H01L 27/00* (2006.01)
*H01L 51/00* (2006.01)
*H01L 51/52* (2006.01)
*H01L 27/32* (2006.01)

(52) U.S. Cl.
CPC ...... *H01L 51/5246* (2013.01); *H01L 27/3244* (2013.01); *H01L 51/0097* (2013.01); *H01L 2251/5338* (2013.01)

(58) Field of Classification Search
CPC ............ H01L 51/5246; H01L 51/0097; H01L 51/001; H01L 51/56; H01L 27/3244; H01L 27/32; H01L 27/326; H01L 27/1218; H01L 2251/5338
See application file for complete search history.

(56) References Cited

U.S. PATENT DOCUMENTS

| | | | |
|---|---|---|---|
| 7,800,386 B2 * | 9/2010 | Nakamura | B81B 3/0005 324/754.03 |
| 10,014,353 B2 * | 7/2018 | Song | H01L 29/08 |
| 2009/0184728 A1 * | 7/2009 | Nakamura | B81B 3/0005 324/755.01 |
| 2013/0072049 A1 * | 3/2013 | Sato | H01R 4/58 439/378 |
| 2017/0104044 A1 * | 4/2017 | Song | H01L 27/32 |

FOREIGN PATENT DOCUMENTS

| | | |
|---|---|---|
| CN | 107452894 A | 12/2017 |
| CN | 107968157 A | 4/2018 |
| CN | 108206244 A | 6/2018 |
| CN | 108277473 A | 7/2018 |
| CN | 108288634 A | 7/2018 |

* cited by examiner

*Primary Examiner* — Nikolay K Yushin
(74) *Attorney, Agent, or Firm* — Muncy, Geissler, Olds & Lowe, P.C.

(57) ABSTRACT

The present disclosure provides a substrate, a display panel and a display device. The substrate includes a body provided with an opening, and guiding protrusions arranged on the body at a position adjacent to the opening.

14 Claims, 3 Drawing Sheets

SUBSTRATE, DISPLAY PANEL AND DISPLAY DEVICE

CROSS-REFERENCE TO RELATED APPLICATION

The present application claims a priority of the Chinese patent application No. 201810826927.9 filed on Jul. 25, 2018, which is incorporated herein by reference in its entirety.

TECHNICAL FIELD

The present disclosure relates to the field of display technology, in particular to a substrate, a display panel and a display device.

BACKGROUND

Recently, along with the development of science and technology, special-shaped screens or bezel-free screens have been widely applied so as to increase a screen-to-body ratio of a display device. In order to further increase the screen-to-body ratio, it is necessary to reserve a place on the display panel for a camera or related sensors, i.e., it is necessary to, as a mainstream scheme, provide an opening on a substrate of the display panel.

SUMMARY

In one aspect, the present disclosure provides in some embodiments a substrate, including a body provided with an opening, and guiding protrusions arranged on the body at a position adjacent to the opening.

In a possible embodiment of the present disclosure, each guiding protrusion is of an elongate shape.

In a possible embodiment of the present disclosure, a length of each guiding protrusion in a radial direction of the opening is greater than a width of the guiding protrusion in a circumferential direction of the opening.

In a possible embodiment of the present disclosure, each guiding protrusion is provided with a bending portion.

In a possible embodiment of the present disclosure, an end surface of each guiding protrusion facing away from the opening is an oblique surface.

In a possible embodiment of the present disclosure, each guiding protrusion has a height not greater than 5 μm.

In a possible embodiment of the present disclosure, a lengthwise direction of each guiding protrusion points toward a center of the opening or is offset from the center of the opening.

In a possible embodiment of the present disclosure, the guiding protrusions are arranged sequentially along the circumferential direction of the opening.

In another aspect, the present disclosure provides a display panel including the substrate according to any one of the above mentioned embodiments.

In yet another aspect, the present disclosure provides in some embodiments a display device including the above-mentioned display panel.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure.

REFERENCE SIGN LIST 1 body
11 opening
12 guiding protrusion
13 oblique surface

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. It should be appreciated that, the embodiments and the features in the embodiments may be combined in any form in the case of no conflict.

Detailed description will be given hereinafter so as to facilitate the understanding of the present disclosure. Of course, the present disclosure may also be implemented in any other appropriate modes, and shall not be limited to those mentioned hereinafter.

The other features and advantages will be described hereinafter, and may become apparent or understandable partially from the embodiments of the present disclosure. The objects and the other advantages of the present disclosure may be implemented and acquired through structures specified in the description, claims and drawings.

The present disclosure will be described herein in conjunction with the drawings.

In the case that a substrate is provided with an opening (a region of the display panel beyond the opening includes a display region), usually an organic layer of a packaging thin film, which functions as to provide a planarization layer and release a stress, merely covers a non-opening region, so as to protect an organic electroluminescence display element from moisture and oxygen. Due to a property of an organic material, in the proximity of the opening region, a peripheral region of the opening may be a region where a non-uniform thickness is provided, and at this region, the thickness of the organic layer may increase and then decrease in a radial direction in the proximity of the opening region (this is because the organic layer may flow in a radial direction in the proximity of the opening region). In other words, the organic layer has the non-uniform thickness in the proximity of the opening region.

Figure 1:
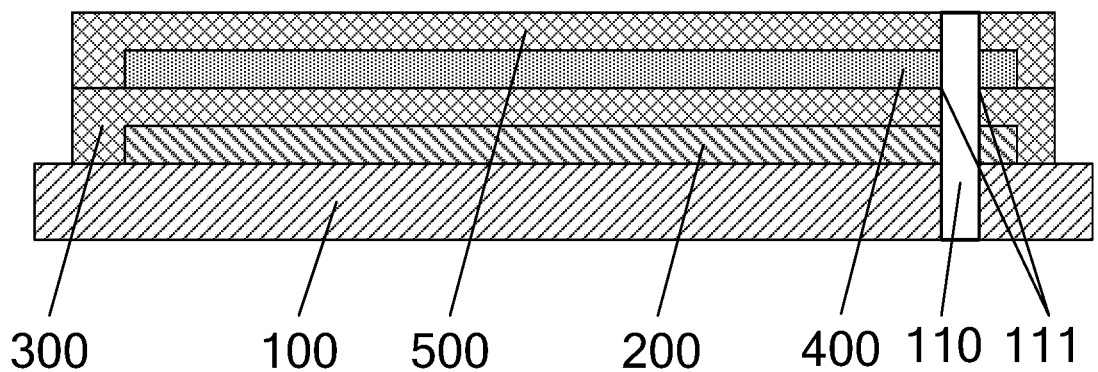
FIG. 1 is a sectional structural schematic view of a display panel in a related art.

FIG. 1 is a sectional structural schematic view of a display panel in the related art, where 100 represents a substrate, 110 represents an opening, 111 represents a peripheral barrier, 200 represents an organic light-emitting diode (OLED) layer, 300 represents an OLED packaging structure, 400 represents an organic layer, and 500 represents an organic layer packaging structure.

The present disclosure provides in some embodiments a substrate which, as shown in FIGS. 2 to 5, includes a body 1 provided with an opening 11, and guiding protrusions 12 arranged on the body 1 at a position adjacent to the opening 11.

According to the substrate in the embodiments of the present disclosure, through the guiding protrusions 12 arranged on the body 1 at a position adjacent to the opening 11, it is able to guide an organic layer during the manufacture of a display panel, and provide the organic layer with a uniform thickness in the peripheral region of the opening 11, thereby to improve the packaging reliability of the display panel.

Figure 5:
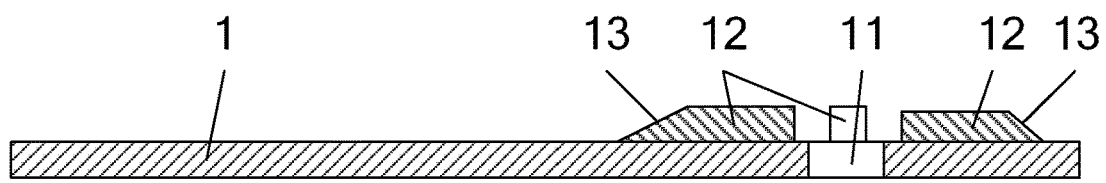
FIG. 5 is still yet another sectional structural schematic view of the substrate according to one embodiment of the present disclosure.

To be specific, each guiding protrusion 12 may be of an elongate shape. A length "a" of each guiding protrusion 12 in a radial direction of the opening 11 may be greater than a width "b" of the guiding protrusion 12 in a circumferential direction of the opening 11, and in a possible embodiment of the present disclosure, a≥1.5b. In addition, as shown in FIG. 5, an end surface of each guiding protrusion 12 facing away from the opening 11 may be an oblique surface 13 (which, e.g., is angled relative to the body 1 at an angle greater than 90°). Different portions of the organic layer have different thicknesses, so different slope angles may be provided with respect to different portions of the organic layer. For example, a relatively gentle slope may be provided for the oblique surface 13 adjacent to a display region of the body 1. Each guiding protrusion 12 may have a height not greater than 5 μm, so as to provide the organic layer with the uniform thickness in the peripheral region of the opening 11.

Figure 2:
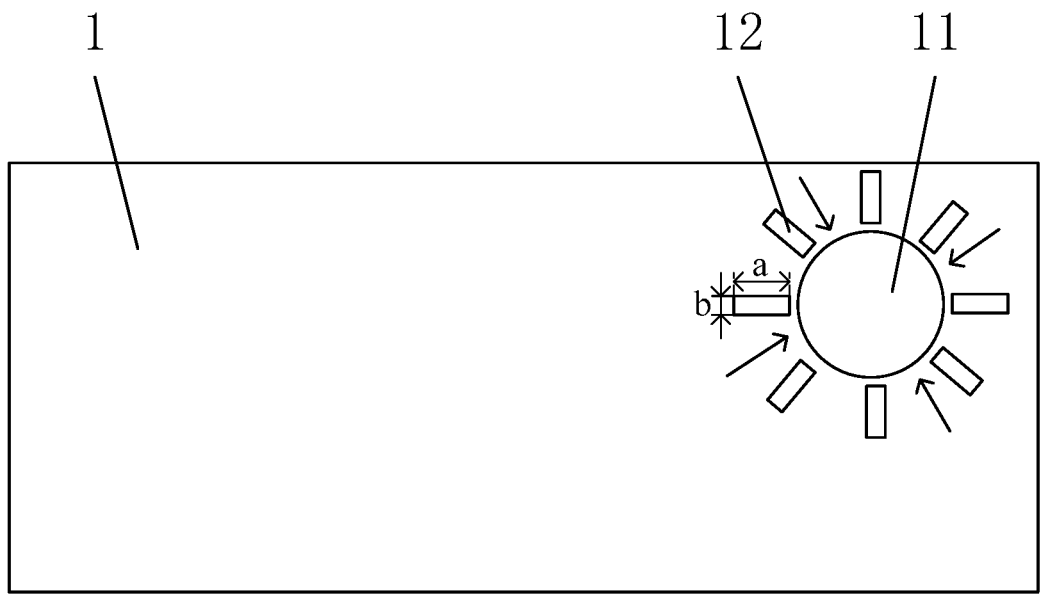
FIG. 2 is a top structural schematic view of a substrate according to one embodiment of the present disclosure.
Figure 3:
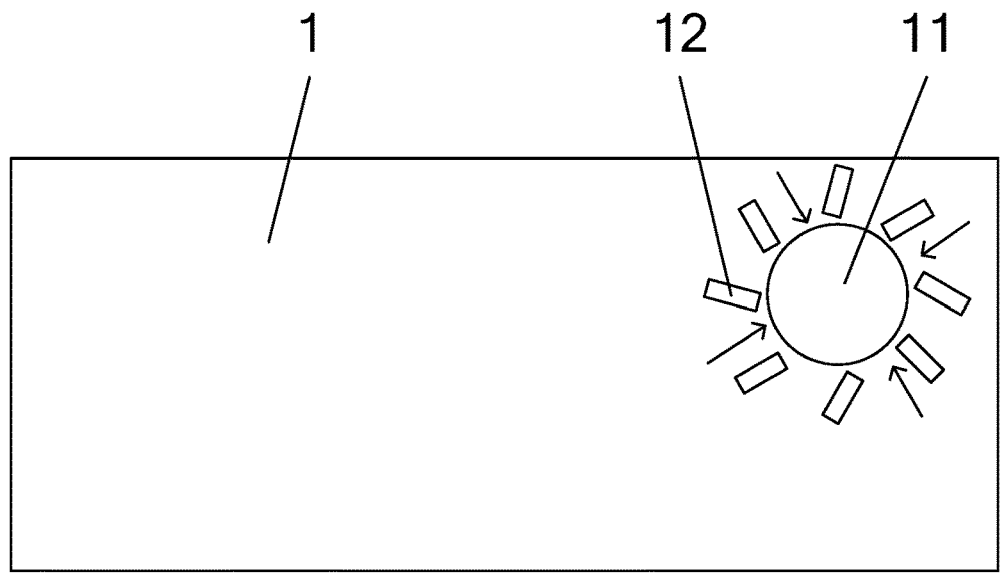
FIG. 3 is another top structural schematic view of the substrate according to one embodiment of the present disclosure.
Figure 4:
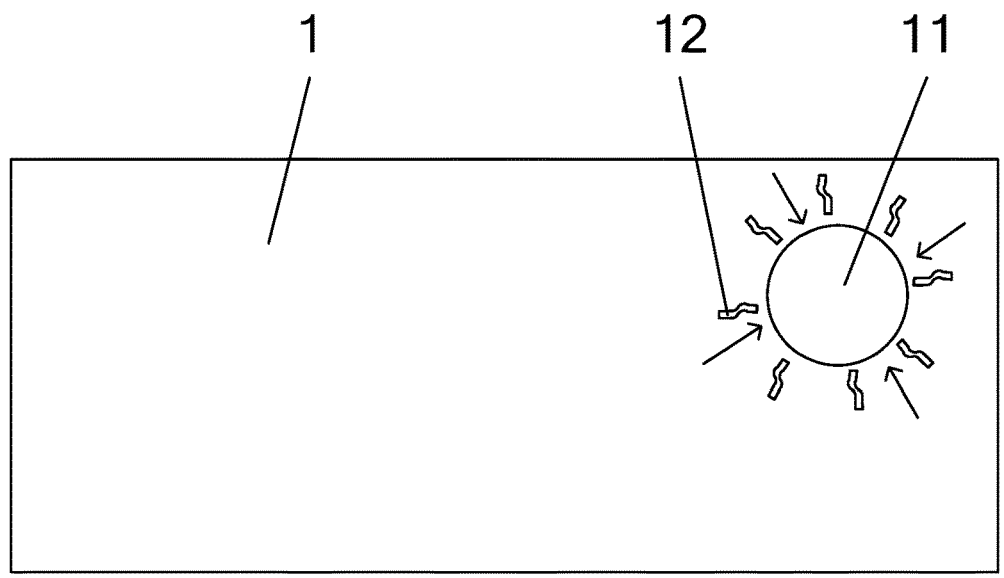
FIG. 4 is yet another top structural schematic view of the substrate according to one embodiment of the present disclosure.

In addition, as shown in FIG. 4, each guiding protrusion 12 may be provided with a bending portion, e.g., a Z-shaped or a S-shaped portion, or, as shown in FIG. 2, a lengthwise direction of each guiding protrusion 12 may point toward a center of the opening 11, or, as shown in FIG. 3, the lengthwise direction of each guiding protrusion 12 may be offset from the center of the opening 11.

To be specific, as shown in FIGS. 2 to 4, the guiding protrusions 12 may be arranged sequentially along the circumferential direction of the opening 11, so as to guide the organic layer within a larger range in the peripheral region of the opening 11 in a better manner, thereby to improve the thickness uniformity in the peripheral region of the opening as well as the asymmetrical levelling of the organic layer (e.g., the organic layer formed through an ink-jet printing process).

Figure 6:
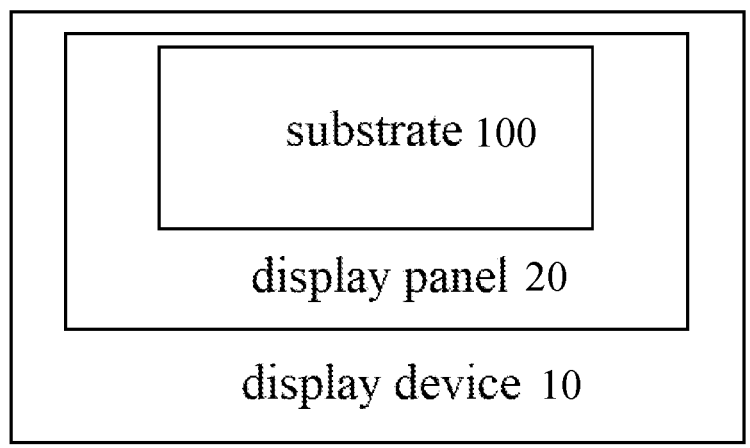
FIG. 6 is a schematic view of a display device according to an embodiment of the present disclosure.

The present disclosure further provides in some embodiments a display panel 20 shown in FIG. 6 including the above-mentioned substrate.

The display panel 20 has all the advantages of the substrate, which will thus not be particularly defined herein.

An Organic Light-Emitting Diode (OLED) layer, an OLED packaging structure, an organic layer and an organic layer packaging structure may be sequentially formed on a side of the substrate where the guiding protrusions are formed. Arrows in FIGS. 2 to 4 represent flowing directions of the organic layer at a position adjacent to the opening 11.

The present disclosure further provides in some embodiments a display device 10 shown in FIG. 6 including the above-mentioned display panel.

The display device has all the advantages of the display panel 10, which will thus not be particularly defined herein.

As compared with the related art, in the embodiments of the present disclosure, through the guiding protrusions arranged on the body at a position adjacent to the opening, it is able to guide the organic layer during the manufacture of the display panel, and provide the organic layer with a uniform thickness at a position adjacent to the opening, thereby to improve the packaging reliability of the display panel.

Unless otherwise specified, such words as "arrange", "connect" and "fix" have a general meaning, e.g., the word "connect" may refer to fixed connection, removable connection or integral connection, or mechanical or electrical connection, or direct connection or indirect connection via an intermediate component, or communication between two components. The meanings of these words may be understood by a person skilled in the art in accordance with the practical need.

Such phrases as "one embodiment", "embodiments", "examples" and "for example" intend to indicate that the features, structures or materials are contained in at least one embodiment or example of the present disclosure, rather than referring to an identical embodiment or example. In addition, the features, structures or materials may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A substrate, comprising a body provided with an opening, and guiding protrusions arranged on the body at a position adjacent to the opening;
   wherein each guiding protrusion is of an elongate shape;
   wherein each guiding protrusion is provided with a bending portion, an orthographic projection of the guiding protrusion on the body is of an S-shape or a Z-shape; and
   wherein the guiding protrusions are arranged sequentially along the circumferential direction of the opening.

2. The substrate according to claim 1, wherein a length of each guiding protrusion in a radial direction of the opening is greater than a width of the guiding protrusion in a circumferential direction of the opening.

3. The substrate according to claim 1, wherein an end surface of each guiding protrusion facing away from the opening is an oblique surface.

4. The substrate according to claim 1, wherein each guiding protrusion has a height not greater than 5 μm.

5. The substrate according to claim 1, wherein a lengthwise direction of each guiding protrusion points toward a center of the opening.

6. The substrate according to claim 1, wherein a lengthwise direction of each guiding protrusion is offset from the center of the opening.

7. A display panel, comprising the substrate according to claim 1.

8. The display panel according to claim 7, wherein an end surface of each guiding protrusion facing away from the opening is an oblique surface.

9. The display panel according to claim 7, wherein a lengthwise direction of each guiding protrusion points toward a center of the opening.

10. The display panel according to claim 7, wherein a lengthwise direction of each guiding protrusion is offset from the center of the opening.

11. The display panel according to claim 7, wherein the guiding protrusions are arranged sequentially along the circumferential direction of the opening.

12. A display device, comprising the display panel according to claim 7.

13. The display panel according to claim 7, wherein each guiding protrusion is of an elongate shape, a length of each guiding protrusion in a radial direction of the opening is greater than a width of the guiding protrusion in a circumferential direction of the opening.

14. The display panel according to claim 13, wherein each guiding protrusion is provided with a bending portion.

* * * * *